(12) United States Patent
Malakooti et al.

(10) Patent No.: US 12,690,388 B2
(45) Date of Patent: Jul. 21, 2026

(54) ADDITIVELY MANUFACTURABLE AND STRETCHABLE THERMOELECTRIC DEVICES

(71) Applicant: University of Washington, Seattle, WA (US)

(72) Inventors: Mohammad Malakooti, Seattle, WA (US); Youngshang Han, Seattle, WA (US)

(73) Assignee: University of Washington, Seattle, WA (US)

( * ) Notice: Subject to any disclaimer, the term of this patent is extended or adjusted under 35 U.S.C. 154(b) by 0 days.

(21) Appl. No.: 18/836,982

(22) PCT Filed: Apr. 25, 2023

(86) PCT No.: PCT/US2023/019869
§ 371 (c)(1),
(2) Date: Aug. 8, 2024

(87) PCT Pub. No.: WO2023/211985
PCT Pub. Date: Nov. 2, 2023

(65) Prior Publication Data
US 2025/0169362 A1 May 22, 2025

Related U.S. Application Data

(60) Provisional application No. 63/335,712, filed on Apr. 27, 2022.

(51) Int. Cl.
*H10N 10/01* (2023.01)
*H10N 10/17* (2023.01)
*H10N 10/82* (2023.01)

(52) U.S. Cl.
CPC ............. *H10N 10/01* (2023.02); *H10N 10/17* (2023.02); *H10N 10/82* (2023.02)

(58) Field of Classification Search
CPC ......... H10N 10/01; H10N 10/17; H10N 10/82
See application file for complete search history.

(56) References Cited

U.S. PATENT DOCUMENTS

| | | | |
|---|---|---|---|
| 6,530,231 B1 * | 3/2003 | Nagy | B60N 3/104 136/203 |
| 9,972,894 B2 | 5/2018 | Dion et al. | |

(Continued)

FOREIGN PATENT DOCUMENTS

| | | |
|---|---|---|
| WO | 2023211985 A1 | 11/2023 |

OTHER PUBLICATIONS

Suarez et al., Flexible thermoelectric generator using bulk legs and liquid metal interconnects for wearable electronics, Applied Energy, vol./Issue 202, pp. 736-745 (Year: 2017).*

(Continued)

*Primary Examiner* — Jayne L Mershon
(74) *Attorney, Agent, or Firm* — Kilpatrick Townsend & Stockton LLP

(57) ABSTRACT

A method of fabricating a wearable and elastically stretchable thermoelectric generator or other thermoelectric device can involve arranging thermoelectric pellets and printing a thermal insulation material alongside and/or around the thermoelectric pellets to form a core layer. The core layer can be cured, and a liquid metal can be selectively deposited on the thermoelectric pellets to form contact points. Printing conductive ink can form stretchable electrical interconnects that define connections among the thermoelectric pellets via the contact points to form an initial middle layer that includes the stretchable electrical interconnects. Printing a thermal interface material may form an initial outer layer positioned between the initial outer layer and an initial side of the core layer to form a layered assembly. The layered assembly may be inverted and receive additional printed layers building away from the core layer, such as an addi- (Continued)

tional interconnect layer and an additional thermal interface layer.

12 Claims, 9 Drawing Sheets

(56)                    References Cited

U.S. PATENT DOCUMENTS

| 10,290,796 | B2 | 5/2019 | Boukai et al. | |
| 10,546,991 | B2 | 1/2020 | Boyd | |
| 10,580,955 | B2 | 3/2020 | Boukai et al. | |
| 2005/0150535 | A1 | 7/2005 | Samavedam et al. | |
| 2013/0333094 | A1 | 12/2013 | Rogers et al. | |
| 2016/0336503 | A1 | 11/2016 | Kasichainula | |
| 2017/0218167 | A1* | 8/2017 | Majidi | C08K 3/08 |
| 2017/0317261 | A1* | 11/2017 | Ozturk | H10N 10/80 |
| 2017/0365766 | A1 | 12/2017 | Boukai et al. | |
| 2020/0028057 | A1 | 1/2020 | Boukai et al. | |
| 2025/0169362 | A1 | 5/2025 | Malakooti et al. | |

OTHER PUBLICATIONS

Han et al., "Printing Liquid Metal Elastomer Composites for High-Performance Stretchable Thermoelectric Generators", Advanced Energy Materials, vol. 12, Issue 34 Available Online at: 'https://onlinelibrary.wiley.com/doi/full/10.1002/aenm.202201413', 2022, 11 pages.

PCT/US2023/019869 , "International Search Report and the Written Opinion", Jul. 12, 2023, 12 pages.

Suarez et al., "Flexible Thermoelectric Generator Using Bulk Legs and Liquid Metal Interconnects for Wearable Electronics", Applied Energy, vol. 202 Available Online at: 'https://www.sciencedirect.com/science/article/abs/pii/S0306261917307420', Sep. 15, 2017, pp. 736-745.

Bang et al., "Fabrication and Cooling Performance Optimization of Stretchable Thermoelectric Cooling Device", ACS Applied Electronic Materials, vol. 3, No. 12, Dec. 2021, pp. 5433-5442.

Bark et al., "Deformable High Loading Liquid Metal Nanoparticles Composites for Thermal Energy Management", Advanced Energy Materials, vol. 11, No. 35, Sep. 2021, pp. 1-11.

Bartlett et al., "High Thermal Conductivity in Soft Elastomers With Elongated Liquid Metal Inclusions", Proceedings of the National Academy of Sciences of the United States of America, vol. 114, No. 9, Feb. 28, 2017, pp. 2143-2148.

Champier , "Thermoelectric Generators: A Review of Applications", Energy Conversion and Management, vol. 140, May 15, 2017, pp. 167-181.

Chen et al., "Flexible Thermoelectric Generators With Inkjet-printed Bismuth Telluride Nanowires and Liquid Metal Contacts", Nanoscale, vol. 11, No. 12, 2019, pp. 5222-5230.

Chiew et al., "A Double Inclusion Model for Liquid Metal Polymer Composites", Composites Science and Technology, vol. 208, May 2021, pp. 1-9.

Chiew et al., "Functional Liquid Metal Nanoparticles: Synthesis and Applications", Materials Advances, vol. 2, Oct. 27, 2021, pp. 7799-7819.

Dickey, "Stretchable and Soft Electronics using Liquid Metals", Advanced Materials, vol. 29, No. 27, Jul. 2017, pp. 1-19.

Fassler, "Liquid-Phase Metal Inclusions for a Conductive Polymer Composite", Advanced Materials, vol. 27, No. 11, Mar. 18, 2015, pp. 1928-1932.

Ford et al., "A Multifunctional Shape-morphing Elastomer With Liquid Metal Inclusions", Proceedings of the National Academy of Sciences of the United States of America, vol. 116, No. 43, Oct. 22, 2019, pp. 21438-21444.

Guo et al., "Microfluidics for Flexible Electronics", Materials Today, vol. 44, Apr. 2021, pp. 105-135.

Guymon et al., "Multifunctional Liquid Metal Polymer Composites", Journal of Polymer Science, vol. 60, No. 8, Apr. 15, 2022, pp. 1300-1327.

Han et al., "Printing Liquid Metal Elastomer Composites for High-Performance Stretchable Thermoelectric Generators", Advanced Energy Materials.

He et al., "Flourishing Energy Harvesters for Future Body Sensor Network: From Single to Multiple Energy Sources", iScience, vol. 24, No. 1, Jan. 22, 201, pp. 1-30.

Hong et al., "Wearable Thermoelectrics for Personalized Thermoregulation", Science Advances, vol. 5, No. 5, May 17, 2019, pp. 1-11.

Jeong et al., "Stretchable Thermoelectric Generators Metallized with Liquid Alloy", Acute Coronary Syndrome Applied Materials and Interfaces, vol. 9, No. 18, May 10, 2017, pp. 15791-15797.

Jia et al., "Wearable Thermoelectric Materials and Devices for Self-Powered Electronic Systems", Advanced Materials, vol. 33, No. 42, Oct. 2021, pp. 1-46.

Kazem et al., "Soft Multifunctional Composites and Emulsions with Liquid Metals", Advanced Materials, vol. 29, No. 27, Jul. 2017, pp. 1-14.

Kim et al., "A Wearable Thermoelectric Generator Fabricated on a Glass Fabric", Energy and Environmental Science, vol. 7, No. 6, 2014, pp. 1959-1965.

Krings et al., "Lightweight, Thermally Conductive Liquid Metal Elastomer Composite with Independently Controllable Thermal Conductivity and Density", Small, vol. 17, No. 52, Dec. 2021, pp. 1-12.

Ladd et al., "3D Printing of Free Standing Liquid Metal Microstructures", Advanced Materials, vol. 25, No. 36, Sep. 24, 2013, pp. 5081-5085.

Leblanc et al., "Material and Manufacturing Cost Considerations for Thermoelectrics", Renewable and Sustainable Energy Reviews, vol. 32, Apr. 1, 2014, pp. 313-327.

Lee et al., "Flexible Heatsink Based on a Phasechange Material for a Wearable Thermoelectric Generator", Energy, vol. 179, Jul. 2019, pp. 12-18.

Lee et al., "Liquid-Metal-Electrode-Based Compact, Flexible, and Highpower Thermoelectric Device", Energy, vol. 188, Dec. 1, 2019, pp. 1-9.

Lossec et al., "Sizing Optimization of a Thermoelectric Generator Set with Heatsink for Harvesting Human Body Heat", Energy Conversion and Management, vol. 68, Apr. 2013, pp. 260-265.

Lu et al., "Highly Sensitive Skin-Mountable Strain Gauges Based Entirely on Elastomers", Advanced Functional Materials, vol. 22, No. 19, Oct. 2012, pp. 4044-4050.

Malakooti et al., "Liquid Metal Supercooling for Low-Temperature Thermoelectric Wearables", Advanced Functional Materials, vol. 29, No. 45, Nov. 2019, pp. 1-9.

Malakooti et al., "Printed Nanocomposite Energy Harvesters With Controlled Alignment of Barium Titanate Nanowires", ACS Applied Materials and Interfaces, vol. 10, No. 44, Oct. 16, 2018, pp. 38359-38367.

Malakooti et al., "ZnO Nanowire Interfaces for High Strength Multifunctional Composites With Embedded Energy Harvesting", Energy and Environmental Science, vol. 9, No. 2, 2016, pp. 634-643.

Markvicka et al., "An Autonomously Electrically Self-healing Liquid Metal-Elastomer Composite for Robust Soft-Matter Robotics and Electronics", Nature Materials, vol. 17, No. 7, Jul. 2018, pp. 618-624.

Neumann et al., "Direct Write Printing of a Self-Encapsulating Liquid Metal-Silicone Composite", Soft Matter, vol. 16, No. 28, 2020, pp. 6608-6618.

Ramesh , "Flexible Thermoelectric Energy Generators using Liquid Metal Interconnects, Bulk Thermoelectric Legs and Low Thermal Conductivity Elastomer", Available online at: https://repository.lib.ncsu.edu/bitstream/handle/1840.20/36982/etd.pdf?sequence=1, 2019, 157 pages.

Ren et al., "High-performance Wearable Thermoelectric Generator With Self-healing, Recycling, and Lego-like Reconfiguring Capabilities", Science Advances, vol. 7, No. 7, Feb. 10, 2021, pp. 1-8.

(56) References Cited

OTHER PUBLICATIONS

Shi et al., "Fiber-based Thermoelectrics for Solid, Portable, and Wearable Electronics", Energy and Environmental Science, vol. 14, No. 2, 2021, pp. 729-764.

Shi et al., "Heterogeneous Integration of Rigid, Soft, and Liquid Materials for Self-healable, Recyclable, and Reconfigurable Wearable Electronics", Science Advances, vol. 6, No. 45, Nov. 6, 2020, pp. 1-8.

Shin et al., "Direct Printing of Sub-30 μm Liquid Metal Patterns on Three-dimensional Surfaces for Stretchable Electronics", Journal of Micromechanics and Microengineering, vol. 30, No. 3, Feb. 13, 2020, pp. 1-10.

Style et al., "Solid Liquid Composites for Soft Multifunctional Materials", Advanced Functional Materials, vol. 31, No. 1, Jan. 2021, pp. 1-21.

Suarez et al., "Designing Thermoelectric Generators for Self-powered Wearable Electronics", Energy and Environmental Science, vol. 9, No. 6, 2016, pp. 2099-2113.

Tavakoli et al., "EGaIn-Assisted Room-Temperature Sintering of Silver Nanoparticles for Stretchable, Inkjet-Printed, Thin-Film Electronics", Advanced Materials, vol. 30, No. 29, Jul. 2018, pp. 1-7.

Tutika et al., "Liquid Metal-Elastomer Soft Composites with Independently Controllable and Highly Tunable Droplet Size and Volume Loading", Acute Coronary Syndrome Applied Materials & Interfaces, vol. 11, No. 19, Apr. 22, 2019, pp. 17873-17883.

Vallem et al., "Energy Harvesting and Storage with Soft and Stretchable Materials", Advanced Materials, vol. 33, No. 19, May 2021, pp. 1-37.

Verma et al., "Recent Trends of Silicon Elastomer-based Nanocomposites and Their Sensing Applications", Journal of Polymer Research, vol. 29, No. 195, May 2, 2022, pp. 1-27.

Wang et al., "Advances in the Development of Liquid Metal-Based Printed Electronic Inks", Frontiers in Materials, vol. 6, Article 303, Dec. 2019, pp. 1-12.

Wang et al., "Flexible Thermoelectric Materials and Generators: Challenges and Innovations", Advanced Materials, vol. 31, No. 29, Jul. 2019, pp. 1-47.

Wang et al., "Liquid Metal (LM) and its Composites in Thermal Management", Composites Part A: Applied Science and Manufacturing, vol. 163, Dec. 2022, 27 pages.

Witting et al., "The Thermoelectric Properties of Bismuth Telluride", Advanced Electronic Materials, vol. 5, No. 6, Jun. 2019, pp. 1-20.

Zadan et al., "Liquid Metal Architectures for Soft and Wearable Energy Harvesting Devices", Multifunctional Materials, vol. 4, No. 1, Jan. 12, 2021, 20 pages.

Zadan et al., "Soft and Stretchable Thermoelectric Generators Enabled by Liquid Metal Elastomer Composites", Acute Coronary Syndrome Applied Materials and Interfaces, vol. 12, No. 15, Mar. 25, 2020, pp. 17921-17928.

Zhang et al., "Fiber-Based Thermoelectric Generators: Materials, Device Structures, Fabrication, Characterization, and Applications", Advanced Energy Materials, vol. 8, No. 5, Feb. 2018, pp. 1-18.

Zhao et al., "Smart Eutectic Gallium-Indium: From Properties to Applications", Advanced Materials, vol. 35, No. 1, Aug. 29, 2022, pp. 1-42.

Zhu et al., "Liquid Metal Based Soft Microfluidics", Small, vol. 16, No. 9, Mar. 2020, pp. 1-32.

Zhu et al., "Recyclable, Healable, and Stretchable High-Power Thermoelectric Generator", Advanced Energy Materials, vol. 11, No. 25, Jul. 2021, pp. 1-7.

* cited by examiner

ADDITIVELY MANUFACTURABLE AND STRETCHABLE THERMOELECTRIC DEVICES

CROSS-REFERENCES TO RELATED APPLICATIONS

This application claims the benefit of PCT Application No. PCT/US2023/019869 filed Apr. 25, 2023, which claims the benefit of U.S. Provisional Application No. 63/335,712 filed Apr. 27, 2022, the entire contents of which are hereby incorporated for all purposes in their entirety.

TECHNICAL FIELD

The present disclosure relates generally to thermoelectric power generators. More specifically, but not by way of limitation, the present disclosure relates to additively manufacturable and stretchable thermoelectric generators.

BACKGROUND

A thermoelectric generator is a semiconductor device that can generate electric power based on a temperature gradient between two regions.

DETAILED DESCRIPTION OF THE INVENTION

Figure 1:
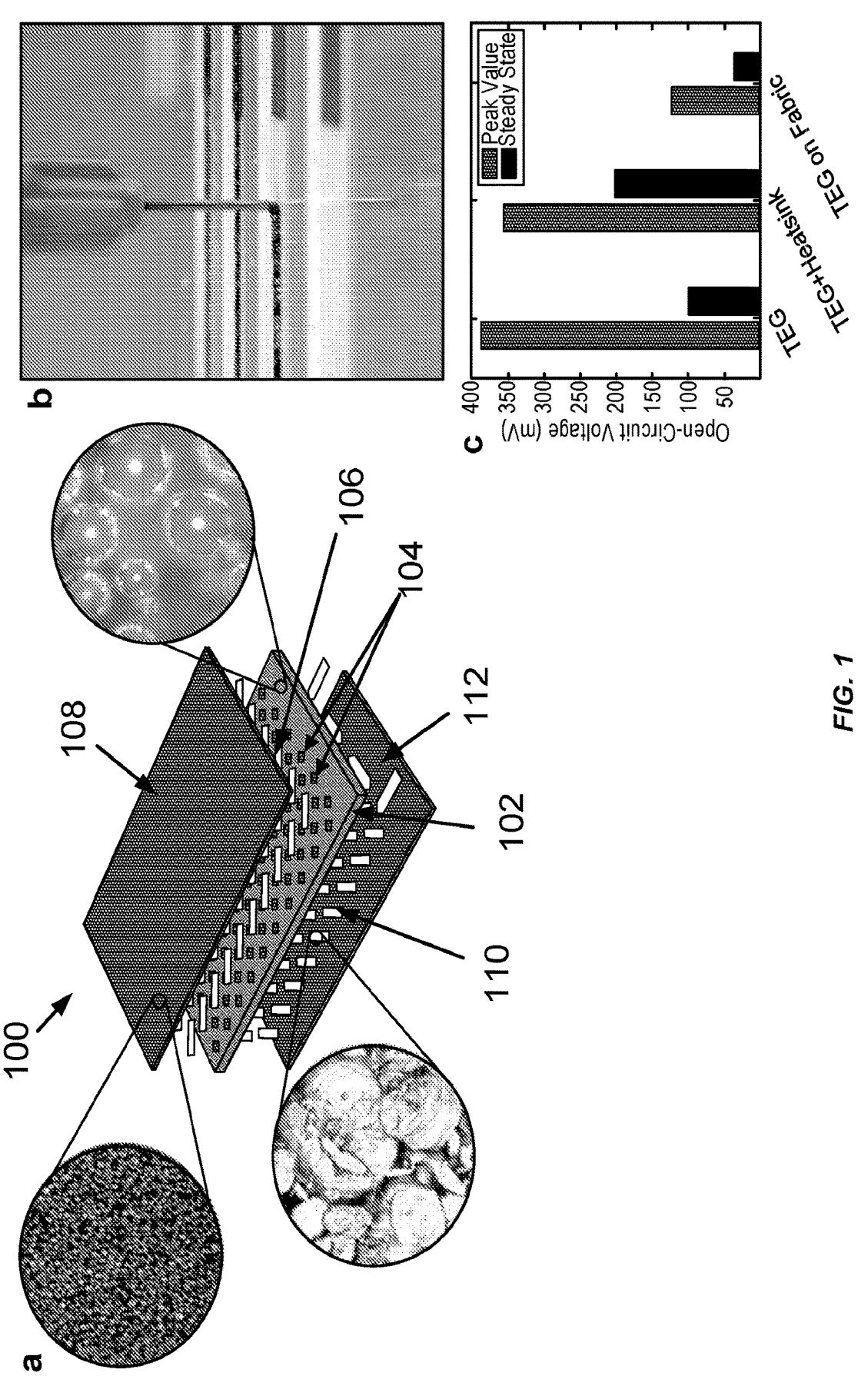
FIGS. 1a, 1b, and 1c is an exploded view of an example of an additively manufacturable and stretchable thermoelectric generator according to some aspects of the present disclosure.

Wearable thermoelectric generators (TEGs) can convert body heat to electricity. Wearable thermoelectric generators can conform to curved surfaces and minimize thermal barriers to be efficient, while exhibiting durability under large deformations. Thermoelectric generators that include inorganic semiconductors and printed multifunctional soft matter may be efficient and stretchable. Liquid metal elastomer composites with tailored microstructures can be printed as conductive thermal interface materials and stretchable interconnects. In some examples, an elastomer composite can include hollow microspheres. The hollow microspheres may be embedded within the elastomer composite. The elastomer composites with hollow microspheres can be printed to form a deformable and lightweight thermal insulator that can be positioned within the device. In one example, a stretchable thermoelectric wearable can generate a voltage of 392 millivolts and a power density of 650 microwatts per square centimeter (650 $\mu$W/cm$^{-2}$) at 60 degrees Celsius. The stretchable thermoelectric wearable can withstand more than 15,000 stretching cycles of 30% strain. Additive manufacturing techniques can be used to apply thermoelectric generators to flexible fabrics to demonstrate their seamless integration and 3D printing of stretchable heatsinks to maintain a large temperature gradient across the device and monitor the effect of convective heat transfer on device performance.

A thermoelectric generator can be implemented to continuously harvest thermal energy. The thermoelectric generator can prevent thermal energy from being wasted due to heat flux. A thermoelectric generator can respond effectively to both continuous and sporadic thermal stimuli. Thermoelectric generators may be suitable for other applications, including internet of things and wearable biomonitoring systems. To utilize the temperature difference between human body and the surrounding environment, previous studies have attempted to integrate thermoelectric (TE) semiconductors into a wide range of material systems such as fibers, thin film, and soft polymers (i.e., elastomers). While each of these device architectures offer unique advantages for wearable applications, elastomers are a popular choice due to their high flexibility and stretchability. Primary elastomer-based TEGs with high performance can be designed by encapsulating rigid inorganic TE semiconductors and flexible conductors (i.e., copper films) encapsulated in silicone elastomers. Limiting factors in this design are inextensible conductors which hinders stretchability and conformability of the device, the low thermal conductivity of elastomers that lowers the efficiency, and the complex fabrication process with large number of components.

Liquid metal (LM) alloys that include gallium, such as eutectic gallium-indium (EGaIn), can be used as flowable electrical interconnects in TEGs. Liquid metals can freely deform with the device while offering a high electrical conductivity (~3.4×10$^6$ S/m). Bulk LM can be incorporated into flexible TEGs in the form of microfluidics, screen-printing, and spray coating. TEGs with LM conductors can include recyclability and self-healing properties that can be desired for wearable electronics.

Liquid metals can have high thermal conductivities (20-30 W/(m·K)) and can be used to enhance the thermal management in thermoelectric devices. By dispersion of LM droplets in silicone elastomers, liquid metal elastomer composites (LMEC) can be created that can exhibit high thermal conductivity and electrical insulation in addition to other enabling functional properties. The embedded LM inclusions can enhance thermal transport in elastomers and have limited effect on their elasticity. Integration of LMEC with conventional rigid TEGs can provide a conformal contact over a large area while enhancing the heat transfer from body. LM-elastomer composites can serve as both thermal interface materials and electrical interconnects. For example, their surfaces can be patterned to create conductive traces. This design can improve the TEG fabrication by eliminating the need for installing hundreds of pieces of small electrodes (e.g., copper foil) while enabling high energy harvesting performance and stretchability. The improved thermal management within the device can contribute to high performances. In some examples, stretchable TEGs can generate a peak voltage of 278.6 mV and a power density of 86.6 microwatts per centimeter square ($\mu W/cm^2$) at a temperature gradient of 60° C. While this novel device architecture shows a great potential for stretchable thermoelectric systems, a scalable fabrication and higher power generation can be used to improve thermoelectric generators for wearable applications.

FIG. 1a is an exploded view of an example of an additively manufacturable and stretchable thermoelectric generator 100 according to some aspects of the present disclosure. The stretchable thermoelectric generator 100 can include a core layer 102. The core layer 102 can include a thermal insulation material positioned alongside and/or around several thermoelectric legs 104 (i.e., thermoelectric pellets.) In some examples, the thermal insulation material can include an elastomer with embedded hollow microspheres. In some examples, the core layer 102 can include N-type thermoelectric legs 104 that can couple with P-type thermoelectric legs 104. The thermoelectric generator 100 can include an upper middle layer 106. The upper middle layer 106 can include a material that can form stretchable electrical interconnects arranged as connections among the thermoelectric legs 104. For example, each electrical interconnect can electrically couple an N-type thermoelectric leg 104 with a P-type thermoelectric leg 104 or vice-versa.

The stretchable thermoelectric generator 100 can include an upper outer layer 108. The upper outer layer 108 can be positioned above the upper middle layer 106, and the upper middle layer 106 can be positioned above the core layer 102 as shown in FIG. 1a. The upper outer layer 108 can include a thermal interface material. The stretchable thermoelectric generator 100 can also include a lower middle layer 110 that can form stretchable electrical interconnects arranged as connections among the thermoelectric legs 104. In some examples, the stretchable electrical interconnects can include liquid metal droplets of eutectic gallium indium, or any other suitable material for stretchable electrical interconnects. In some examples, the stretchable thermoelectric generator 100 can include a lower outer layer 112 that can include a thermal interface material. The thermal interface material present in the lower outer layer 112 can be the same or different than the thermal interface material present in the upper outer layer 108. In some examples, the thermal interface material can include a liquid metal elastomer composite. In some examples, the layers of the stretchable thermoelectric generator 100 can be printed layers made from one or more printable materials. In some examples, the layers can exhibit elastic properties such that they can temporarily deflect in response to an applied force and return to their original sizes after the applied force has ceased. In some examples, the thermoelectric generator can include a liquid metal proximate the thermoelectric legs 104. Liquid metal can be selectively deposited on the thermoelectric legs 104.

A printed wearable thermoelectric generator system with high stretchability and efficiency can be achieved by 3D printing and/or selectively depositing elastomer composites with engineered functional and structural properties at each layer. As illustrated in FIG. 1a, the printed TEG can include two thermal interface elastomer (TIE) layers and one insulation layer which can separate the two and can encapsulate Bi2Te3 thermoelectric semiconductors.

In this design, the printed LMEC with high thermal conductivity can serve as a thermal interface material while the insulation layer can be printed with hollow microspheres embedded elastomer to reduce the density and heat dissipation. Moreover, one can print different LMEC with large LM droplets to function as stretchable electrical interconnect between the semiconductors (FIG. 1b). Placing thermoelectric semiconductors can be done by robotic arm or machine, and the entire device fabrication process can be automatically completed. This wearable TEG can survive over a 15,000 cyclic loading test under 30% strain while undergoing a minuscule change of resistance in various examples. The device can be stable over long-term use bearing deformations such as strain, twist, and bending whilst showing more than a 7-fold power density increment. Moreover, additive manufacturing enables novel applications such as printing thermoelectric device on fabric or other flexible and/or stretchable bases. Not only that, one can also 3D print a stretchable heatsink on the TEG device so that the device can be stretched and conformed to the target surface (e.g., FIG. 5d). FIG. 1c illustrates the effect of integrating stretchable heatsink by comparing the open-circuit voltages of each device. The peak voltage of printed TEG with the heatsink can be slightly lower than that of the device without it because of minor deviation in the fabrication process, but the steady-state voltage can be much higher due to the existence of the stretchable heatsink.

The design of the stretchable and wearable thermoelectric herein can be driven by additive manufacturing of elastomer composites and integration of solid semiconductors. To fabricate TEG devices, five printing steps can be conducted on an array of TE pellets (i.e., TE legs) as illustrated in FIG. 2a. First (e.g., as depicted by way of example at 202), inorganic p/n-type thermoelectric semiconductors can be arranged diagonally inside a mold. They can be assembled in an alternating order so that a complete circuit can be formed after printing the electrical interconnects. Bismuth telluride (Bi2Te3) can be used as the TE materials since they can have high figure of merit (zT) due to the low lattice thermal conductivity and high electrical conductivity around the room temperature. Also, their ample thermoelectric quality factors (B) can make them suitable for the TEG application. After arrangement of the TE pellets, one can print the thermal insulation layer and fill up the gap between the pellets. This middle layer can be made of a hollow microsphere embedded elastomer composite to primarily reduce the bypassed heat flux in this layer. This can result in provision of a core layer 102, such as described with respect to FIG. 1.

After curing the thermal insulation layer, one can selectively deposit (e.g., sputter) liquid metal on top of the TE legs using an airbrush to mitigate the contact resistance between the semiconductors and the interconnects. Next, as shown at 204, an uncured LMEC with large liquid metal droplets can be directly printed to connect the TE pellets and can serve as stretchable interconnects on one side. This can result in provision of an upper middle layer, such as the upper middle layer 106 shown in FIG. 1. Because of their high density and large particle size (D>100 μm), the LM droplets rapidly sediment on the TE pellets and the middle layer. Next the LM inclusions can be "mechanically sintered" or "activated" by applying physical pressure on the cured traces. In this process, the gallium oxide interphase ruptures and forms a percolating network which connects the p-type and n-type TE legs to complete one side of the circuit. After the activation, an electrically insulating LM-elastomer composite with a high thermal conductivity can be printed on top of the specimen to serve as a stretchable thermal interface layer, as shown at 206. This can result in an upper outer layer, such as the upper outer layer 108 shown in FIG. 1. The same steps can be applied to the other side of the sample at 208 (e.g., after inverting the previous layered assembly) to complete the fabrication of a highly deformable and stretchable thermoelectric generator, such as the stretchable thermoelectric generator 100 shown in FIG. 1.

FIG. 2c shows an example of an additively manufacturable thermoelectric generator with 120 TE pellets and the final dimension of 51.5×32×2.4 mm^3. The fill factor of this device can be calculated to be 14.27%-indicating the area fraction filled by the TE materials. As depicted in FIG. 2d, this TEG device with rigid TE pellets shows excellent flexibility to be worn on body or conform to curved surfaces. The proposed additive manufacturing can enable design freedom for thermoelectric wearables and can enable customized device architectures. For instance, the size of TE pellets and the fill factor of the TEG can be seamlessly altered. A fill factor of ~14% can be chosen to enable high energy harvesting performance and structural integrity without significant trade-off. However, additional optimization studies can be performed to determine a device architecture to enable increased power output through thermoelectric energy harvesting.

Figure 2:
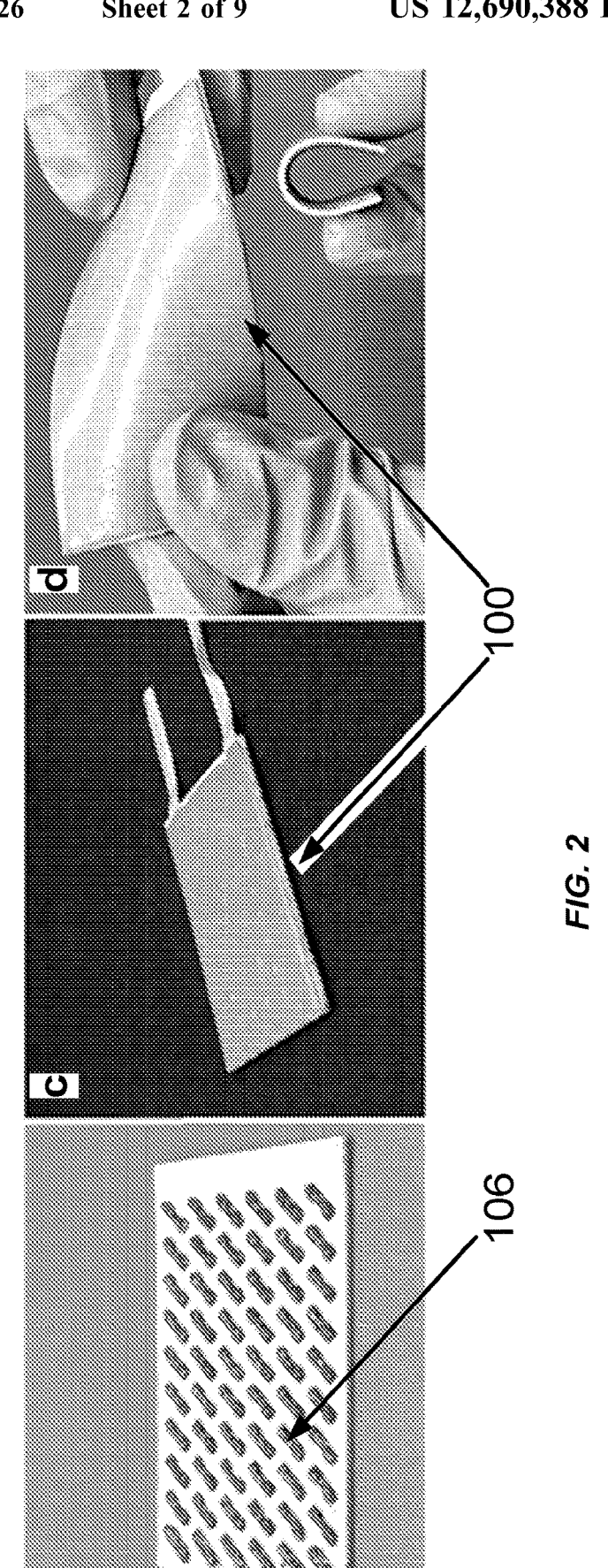
FIGS. 2a, 2b, 2c, and 2d include exemplary depictions of individual layers that may be present in an additively manufacturable and stretchable thermoelectric generator according to some aspects of the present disclosure.

FIG. 2 depicts design and fabrication of stretchable thermoelectric generators (TEGs) and includes: (a) Schematic of the layer-by-layer fabrication process for soft-matter TEG. (b) Photograph of printed liquid metal elastomer composites for interconnects. (c) A TEG with 120 Bi2Te3 thermoelectric semiconductors, the dimension of the device can be 51.5× 32×2.4 mm^3. (d) Printed TEG is being deformed to demonstrate its high flexibility.

Three different functional elastomer composites can be formulated to print components of the TEGs. This can include 50% volume fraction (Vf) LMEC with sub-5 μm LM inclusions, 30% volume fraction LMEC with larger LM droplets (>100 μm), and hollow microsphere elastomer composite (HMEC). Polydimethylsiloxane (PDMS) can be used as the matrix phase while the type of fillers and processing parameters can be altered to fabricate these composites with specific properties.

The 50% Vf LMEC can be used on thermal interface layer to provide effective heat conduction while electrically insulating even when external loads are applied. To achieve these objectives, the size of liquid metal inclusions can be engineered to be in the range of 2-5 μm. At this length scale, the embedded LM droplets can show resilience when being bent, stretched, or compressed and can be uniformly dispersed in PDMS as shown in FIG. 3a. Since thin and uniform printing can be desirable for this layer, one can added 5% weight fraction hexane (C6H14) into the ink to decrease the viscosity and further improve the print quality. Micrographs of the top and bottom region of LMEC cross section in FIG. 3b-c indicate uniform distribution of LM microdroplets without sedimentation. This consistency throughout the thickness of printed LM-elastomer composites enables uniform thermal conductivity in this layer which can enable effective thermal management in wearable TEGs.

Figure 3:
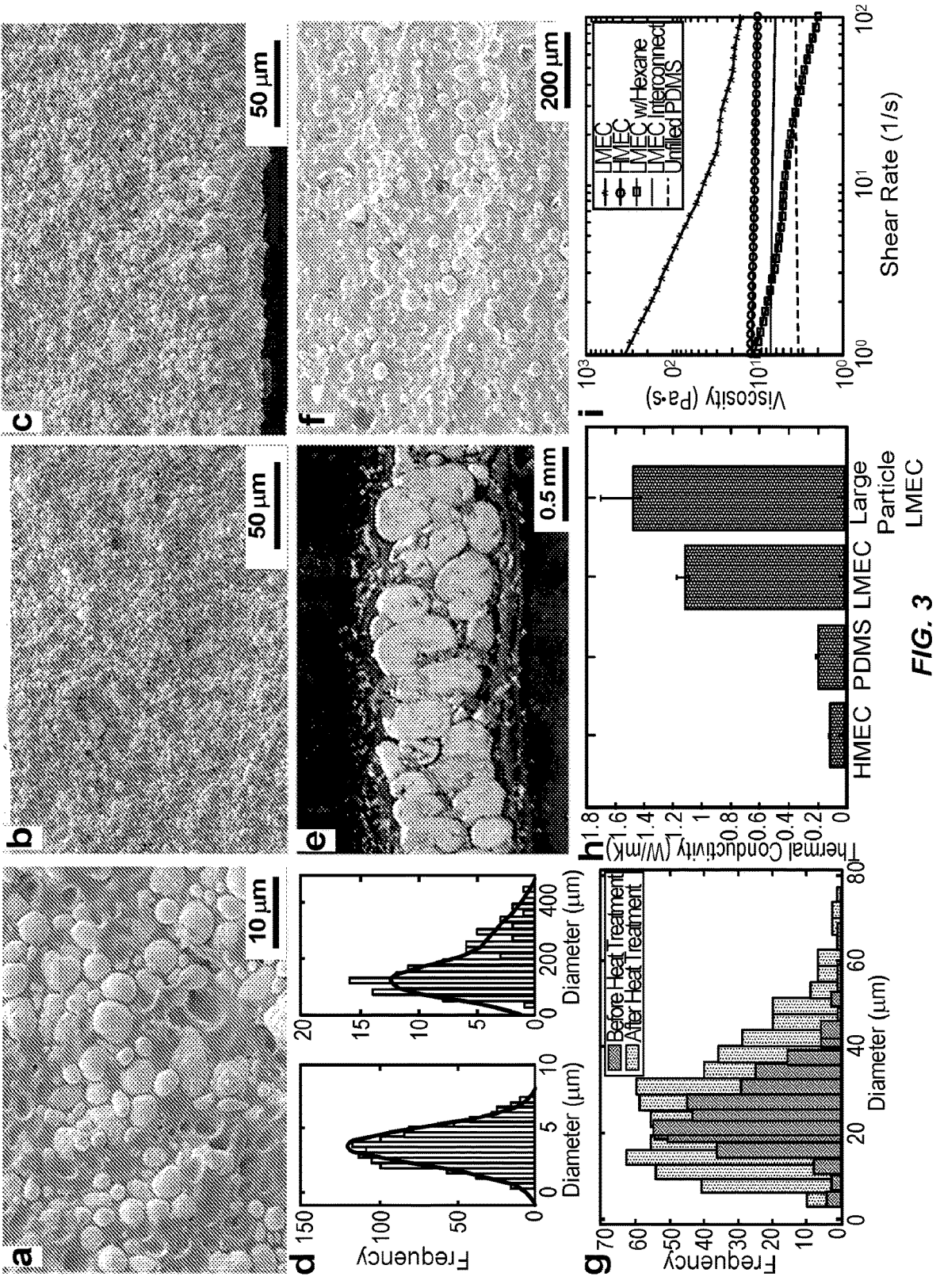
FIGS. 3a, 3b, 3c, 3d, 3e, 3f, 3g, 3h, and 3i include exemplary depictions of soft multifunctional matter that is usable in additively manufacturable and stretchable thermoelectric generators and data associated therewith according to some aspects of the present disclosure.

As illustrated in FIG. 3d, the 30% LM volume fraction elastomer composite for interconnects has much larger droplet size compared to the LM droplets in the printed thermal interface layer. Their large size facilitates the activation of LM droplets and formation of a percolating network inside the elastomer matrix. FIG. 3 shows the bottom view of a printed trace of LMEC with ~150 μm EGaIn droplets and their sedimentation that occurs rapidly after printing. This size of LM inclusions can be suitable for direct-ink-writing of the interconnects and their activation. While printing bulk liquid metal can be challenging due to the high surface tension of EGaIn, LM-elastomers can easily be printed and utilized as an electrical pathway. The LMEC interconnects show high stretchability and great electrical conductivity (5.16×10^5 S/m) which enable the interconnects to function as conductors for wearable thermoelectric generators.

The thermal insulation layer between the cold and hot sides in TEGs can have a large impact on the thermoelectric power generation and steady performance. One can formulate a printable elastomer composite that offers unique features in addition to low thermal conductivity. FIG. 3f shows the thermal insulation layer made of dispersed hollow microspheres in PDMS at Vf=50%. These microspheres can increase in diameter when the composite cured at an elevated temperature (FIG. 3g). Since the embedded microspheres can be extremely lightweight and dilate by heat, they can decrease the density of the ink to 0.6367 g/cm^3 which indicates 35.2% weight reduction compared to neat PDMS Another positive effect of the microspheres can include the reduced thermal conductivity of the PDMS as indicated in FIG. 3h. In terms of mechanical properties, the printed HMEC shows high conformability which allows better contact between the TEG and the heat source. The novel thermal insulation layer enhances the energy harvesting performance of TEGs as it makes them more comfortable wearable device due to the reduced weight and high flexibility.

Figure 6:
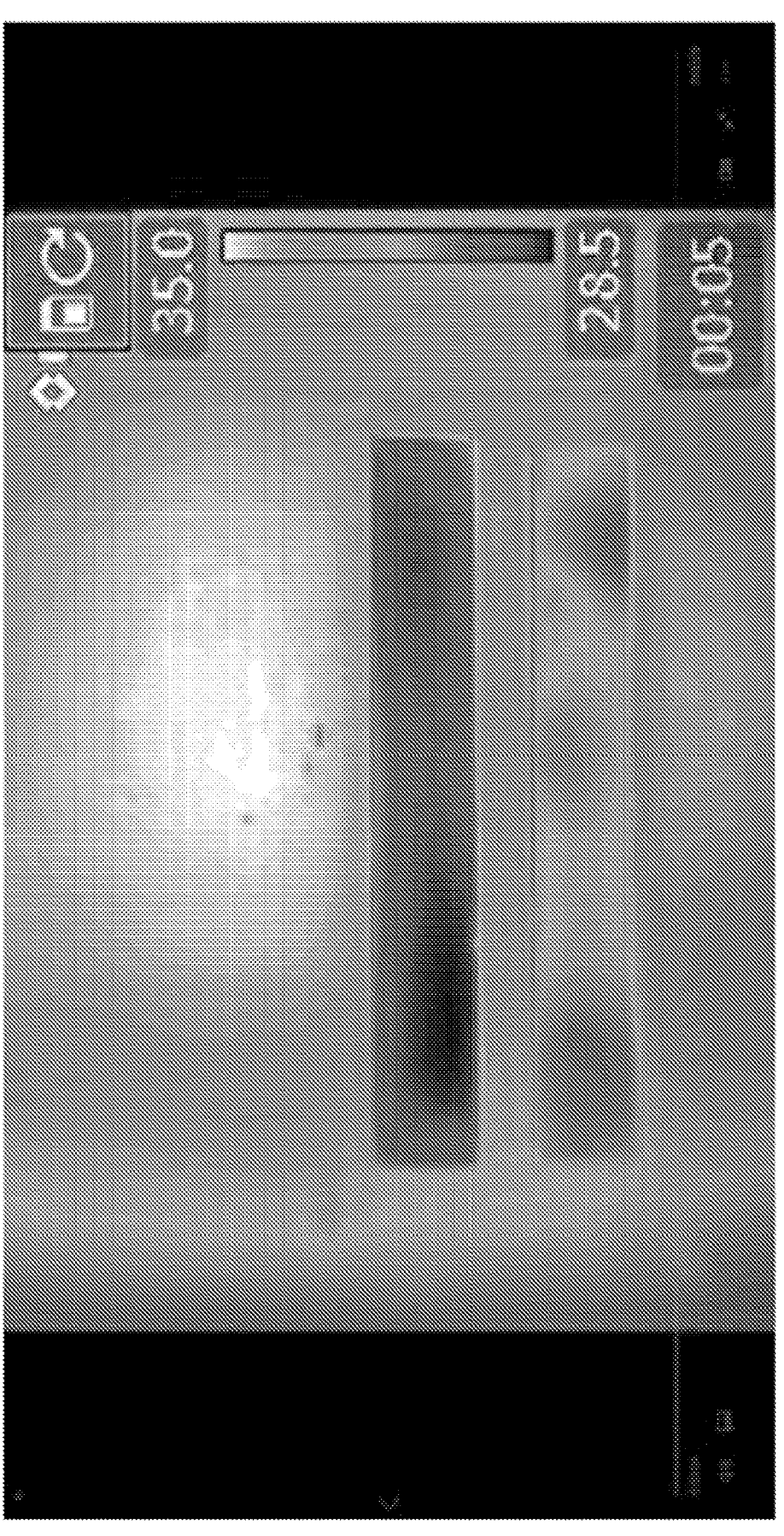
FIG. 6 includes an exemplary depiction of infrared data associated with stretchable thermoelectric generators according to some aspects of the present disclosure.

One can measure the thermal conductivity of the soft-matter composites to ensure there is a large mismatch between their heat conduction behavior. Using the transient hot-wire method, the thermal conductivity of LMEC (Vf=50%, d=2-5 μm) can be measured to be ~1.1 W/(m·K). The embedded LM microparticles increase the thermal conductivity of the unfilled PDMS (0.19 W/(m·K)) by ~480%. While increasing the size of LM inclusions further improves the thermal conductivity of the LM-PDMS, it can result in an uneven dispersion of LM droplets and make them more prone to be damaged and leak. The slight decrease in the thermal conductivity of LMEC with smaller particles can be due to the core-shell structure of the inclusions and matches very well with the previous experiment and modeling data for these composites. One can also measure the thermal conductivity of HMEC for the thermal insulation layer to be ~0.11 W (m·K). This means that the conductivity of the LMEC can be 10 times that of the middle layer's thermal conductivity. The tailored properties of each layer can enable effective transfer of heat to TE legs while limiting the in-plane heat dissipation and maintain the temperature gradient across the device over time in the thermoelectric device which consequently improves the energy harvesting performance. The difference in heat conduction between unfilled PDMS and a lightweight thermal insulation layer can be clearly observable via infrared (IR)

imaging as shown in FIG. 6, where the unfilled PDMS is in the upper portion of the view and the lightweight thermal insulation layer is in the lower portion of the view.

FIG. 3 depicts soft multifunctional matter for stretchable TEGs and includes (a) Scanning electron microscopy (SEM) image of 50% LMEC for thermal interface layer printing. (b-c) top and bottom region of the thermal interface layer with uniformly dispersed LM inclusions. (d) Size distribution of LM particles in LMEC in thermal interface layer (left) and interconnects (right). (e) Microscopic image of a printed trace of interconnects with a size of ~150 μm LM droplet. (f) SEM image of hollow microsphere elastomer composite (HMEC) for thermal insulation layer printing. (g) The size distribution of the microspheres before and after curing of the composite—showing the expansion of the thermoplastic microspheres. (h) Thermal conductivities of the lightweight thermal insulation layer (HMEC), Sylgard 184 (PDMS), and thermal interface layer (LMEC). (i) Viscosity of printing inks as a function of shear rate that shows the printability.

It may be helpful to understand the viscosity of each ink to confirm their printability. As illustrated in FIG. 3*f*, incorporation of LM and microspheres increases the viscosity of the PDMS. The rheology study of LMEC shows it has a comparable viscosity and thixotropic behavior to previously reported liquid metal composites, but smaller LM particle size results in a small increment in the viscosity. The addition of hexane in the thermal interface LMEC can decrease the viscosity which can enable a desirable layer structure at a low printing pressure. In contrast, LMEC interconnect ink can exhibit a moderate change in viscosity due to the larger size of LM inclusions and can allow effortless direct ink writing of stretchable conductors. Rheology test of the insulation layer ink shows an increase in the viscosity as microspheres are added to the PDMS. The rheology results indicate that all the elastomer composites can be 3D printed for the fabrication of flexible TEGs.

The open-circuit voltage and power output of the TEG device with 120 TE pellets can be measured to evaluate its energy harvesting performance. Assuming constant room temperature on the cold side, the temperature can be increased on the hot side of the device using a hotplate. As shown in FIG. 4*a*, the generated open-circuit voltage (VOC) in the device increases linearly with temperature gradient (ΔT). While having negligible variations in VOC measurements, the peak voltage output reaches up to 392 mV at ΔT=60° C. At lower temperature gradients, the delivered heat flux to the embedded semiconductors can be reduced, thus the generated VOC can be relatively smaller. For instance, a voltage output of 96 mV can be measured when the temperature difference between the two sides of the device is set to 10° C. It should be mentioned that a high VOC can be achieved without using a heatsink or cooling device. The performance of the wearable thermoelectric generator may increase when an aluminum block is placed on the device to increase the voltage/power output.

To quantify the power generation capability of printable TEG, the device can be connected to external load resistor (Rex) and the output voltage can be measured. FIG. 4*b* shows the measured voltage for three different temperature gradients ΔT=20° C., 40° C., and 60° C.) across the external load resistors changing from 1 to 60 Ohms. This response indicates that output voltage from TEG can be highly dependent on the heat flux while a similar trend can be observed at each temperature gradient.

The measured voltage ramps up sharply at the beginning and then converges to the open-circuit voltage as the external resistance increases. At Rex=60 Ohms or higher, the changes in the voltage output are negligible and it can behave like an open circuit. With the output voltage as a function of external resistance load, the generated power (P) can be estimated by $P=V^2/Rex$. FIG. 4*c* illustrates the power and the corresponding power density estimated power normalized by the device area. At all the three different temperature gradients, the maximum power appears at Rex of ~3 Ohms. As predicted, the optimal load resistor can be close to the internal resistance of the device (Rint=3.9 Ohms). At ΔT=60° C., a power of 10.7 mW and a power density of 649.9 μW/cm^2 can be measured. There are several factors that influenced the improvement of the performance and eliminated the need for a bulky heatsink. First, the highly conductive thermal interface with uniformly dispersed LM particles in the PDMS matrix allows it to deliver heat efficiently to TE pellets and release the heat faster. Also, the printing method allows it to have 0.4 mm thick thermal interface layers on both sides that bolster the heat flux through the device. Moreover, low thermal conductivity of the insulation layer reduces heat dissipation in the in-plane (i.e., lateral) direction and guides the heat to be concentrated on the TE legs by minimizing the thermal bypass through this material. Furthermore, the thin LMEC layer and higher conformability of the insulation layer gives better contact to the device with the heat source. Thus, the tailored properties at each layer and improved form factor are combined to enhance the thermal management in the device which leads to drastically improved energy harvesting performance.

Figure 4:
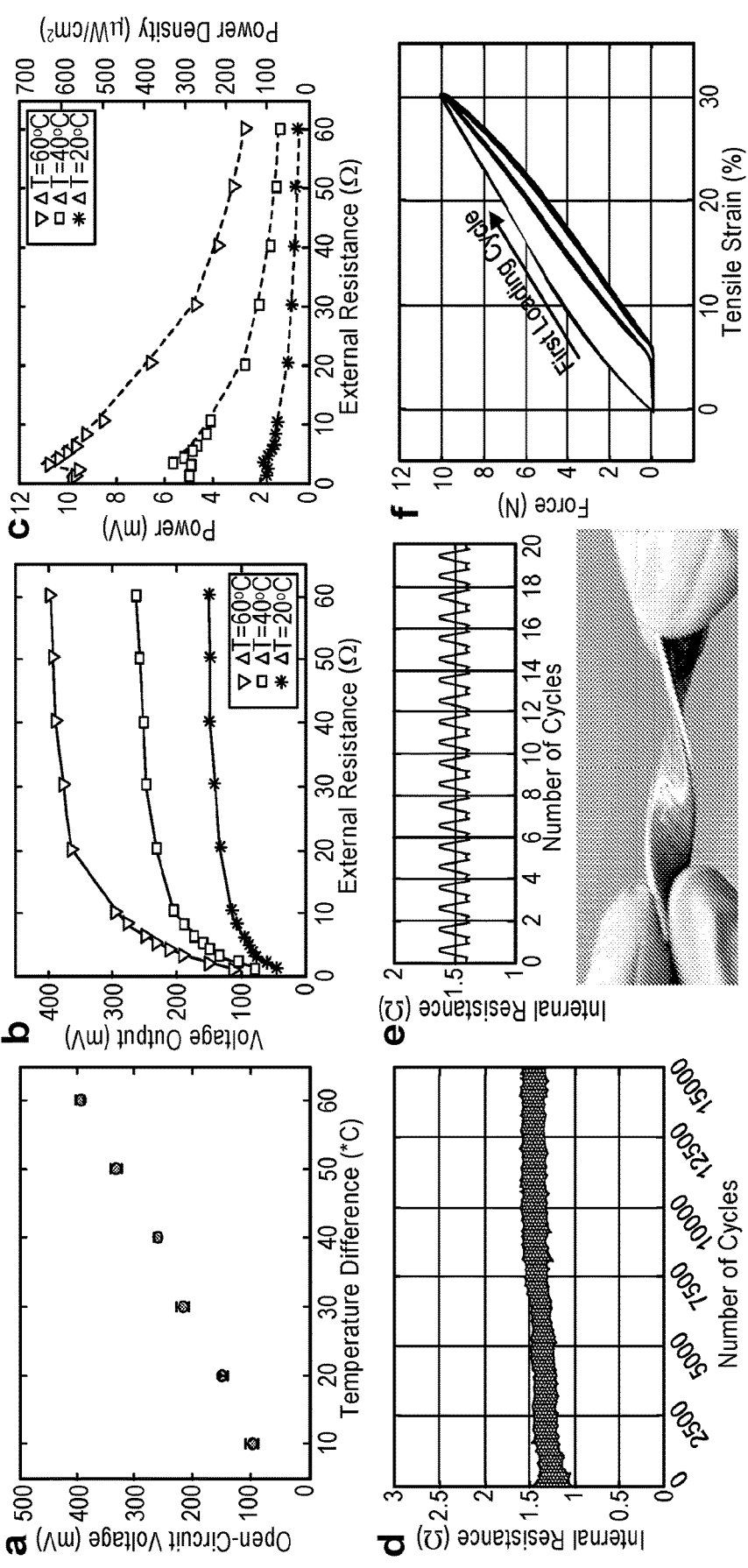
FIGS. 4a, 4b, 4c, 4d, 4e, and 4f include graphs of data associated with the elastic properties that an additively manufacturable and stretchable thermoelectric generator may exhibit, according to some aspects of the present disclosure.

FIG. 4 depicts Energy harvesting performance and structural integrity of TEG and includes: (a) Open-circuit voltage (VOC) as a function of the temperature difference (ΔT) on the top and bottom layer. (b) Measured output voltage versus external resistor load at different temperature gradients. (c) Estimated power and power density of the printed TEG showing the same optimal load resistance at three different temperature gradients. (d) Internal resistance of a TEG tensile sample under 15,000 cycles of uniaxial tensile loading with 30% maximum strain. (e) Endurance of TEG after being stretched by 30% for 15,000 cycles:

steady electrical resistance (top) and photograph of the TEG under torsion without any damage or failure (bottom). (f) Hysteresis of TEG tensile sample under uniaxial load up to 30% strain.

Robustness under deformation can be a critical factor for stretchable electronics. Printable TEG devices were examined under uniaxial tension to investigate their stability and structural integrity for wearable applications. Rectangular shaped tensile specimens with the same design architecture and characteristics can be prepared for this purpose. This tensile specimen with 16 TE pellets and a total dimension of 70×11×2.4 mm^3 had an initial resistance of 1.10 Ohms. After applying 15,000 cycles of tensile strain (0-30%) at the rate of 20 mm/min, the final resistance can be measured to be 1.28 Ohms under the stress-free condition. A maximum strain of 30% can be chosen for this test because that is the maximum tolerable strain for human skin and a common design criterion for electronic tattoos and wearables. As shown in FIG. 4*d*, the electrical resistance of the wearable TEG sample can increase slowly until the 8,000 cycles and may begin to plateau afterwards.

After completing 15,000 cycles, the device can remain fully functional without electrical or mechanical failure. To determine the electrical stability, the VOC of the tensile specimen can be examined. Before and after the 15,000 cycles of mechanical loading, 29.6 mV and ~31 mV at $\Delta T=40^\circ$ C. can be measured, respectively. Moreover, zoomed-in view of the captured signal after the cyclic test indicates that the resistance proportionally increases as the sample stretches to the maximum strain and it decreases as the sample comes back to its original length (FIG. 4e). The small peaks at every 0% strain indicates the bending of sample at zero displacement which is cause by the viscoelastic response of the elastomer composites. The photograph of the twisted TEG in FIG. 4e shows that the tensile sample is fully intact after 15,000 loading cycles. To further characterize the elastic behavior of the TEG device, one can measure the load as a function of applied strain at the same rate. As depicted in FIG. 4f, the device can show strain softening after the first cycle (i.e., Mullin's effect) while there is a negligible hysteresis behavior between loading and unloading in the consecutive cycles. The mechanical robustness and electrical stability of the printed thermoelectric generators under continues deformation along with their high energy harvesting performance makes them excellent candidates to realize self-powered wearable electronics.

Additive fabrication of TEGs enables creative device architectures and integrations. For instance, thermoelectric generators can be directly printed on stretchable fabrics or curved surfaces. A layer of thermal interface LMEC can be printed on a highly stretchable textile (95% polyester, 5% spandex) and then the rest of the TEG can be assembled on the uncured LMEC to complete the device fabrication. As demonstrated in FIG. 5a, this wearable TEG can be easily wrapped around the arm and be stretched and deformed due to the high stretchability of both the device and the fabric. This shows that the printed LM-PDMS composite bonds strongly to both the middle layer and the fabric and allows seamless integration of thermoelectric into garments and sportswear.

The open circuit voltage can be measured to investigate the effect of introducing another layer (i.e., thermal barrier) on the thermoelectric energy harvesting. The fabricated wearable TEG shows an internal resistance of 3.2 Ohms while having the same dimensions as the previous TEGs. The difference can be the presence of the fabric on the hot side. FIG. 5b shows that the open-circuit voltage can be linearly proportional to the temperature difference while the overall performance can be decreased since the fabric can be working as a thermal barrier. The median of open circuit voltage can be 120 mV at $\Delta T=60^\circ$ C. which is ~70% lower than that of the printed TEG device without the extra layer of the fabric. Textiles with relatively high thermal conductivity can mitigate this issue and allow enhanced thermoelectric energy conversion.

Printing stretchable heatsinks with controlled geometry can be another advantage of the additive manufacturing of TEGs. While the existence of heatsink on thermoelectric energy harvester promises performance improvement, previous studies on the heatsink for this application rather focused on the size optimization or the change in materials that can be flexible. For the first time, one can demonstrate 3D printing of a heatsink on top of the thermoelectric generator which can be flexible and stretchable. FIG. 5c shows the TEG device with a printed stretchable heatsink. As in thermal interface layer printing, 50% Vf LMEC can be used as a printing material to print 1 mm tall rectangular heatsink by stacking up the printed layers with 1 mm gap. Since the same material can be used for printing the heatsink and the thermal interface layer on the cold side, these two layers may become one part after curing and show uniform elastic and thermal properties. This ensures the structural integrity while improving the heat dissipation ability of the device. As illustrated in FIG. 5d, the 3D printed heatsink (i.e., passive heat exchanger) can deform and stretch with the device which can provide a high mechanical robustness and conformability.

Figure 5:
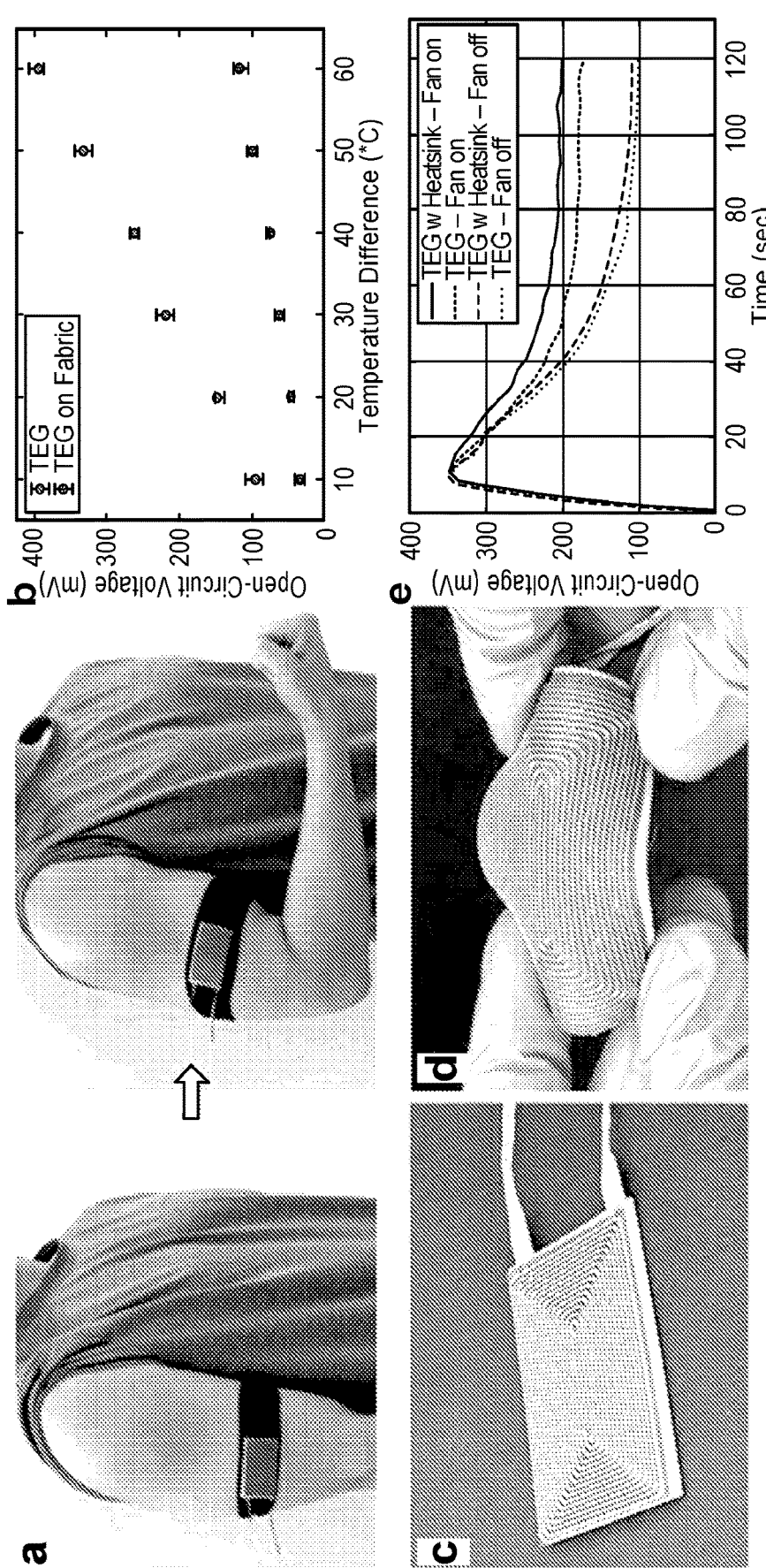
FIGS. 5a, 5b, 5c, 5d, and 5e include depictions of additively manufacturable and stretchable thermoelectric generators according to some aspects of the present disclosure.

FIG. 5. includes: (a) A printed wearable TEG device printed on the fabric, tied around the biceps at rest (left) and at buffed state (right). (b) Open-circuit voltage (VOC) of the TEG device and TEG on the fabric as a function of the temperature difference ($\Delta T$). (c) A stretchable heatsink printed on TEG. (d) Deformed TEG with the stretchable heatsink. (e) Open-circuit voltage (VOC) of the TEG as a function of time (t) with varying the existence of the heatsink and fan at ($\Delta T$)=60° C.

The ability to fabricate thermoelectric modules with 3D printed heatsink allows studying the effect of heatsink and convective heat transfer on thermoelectric energy harvesting. One can measure the open-circuit voltage of the TEG devices with and without heatsink. One can also use a fan to blow air and study its effect on voltage generation over time. FIG. 5e shows the VOC in four different conditions until the temperature gradient within the device plateaus. During this test, the hot side temperature can be set to create a temperature difference of 60° C. with the room temperature. At all multiple conditions, the TEGs can exhibit the same behavior as the device becomes in contact with the hot surface. They also reach the same peak voltage, but the steady state voltage outputs are different.

Without forced air convection (Fan off), the TEG with heatsink can generate a VOC of 109.4 mV at the steady state which is higher than that of the device without heatsink by 7.7 mV. However, the difference in voltage generation between the two devices can be quite distinct when they are subjected to forced convection, such as air blown by a fan. The TEG with 3D printed heatsink produces a voltage of 201 mV while the voltage of the reference TEG can be measured to be 172.5 mV under forced heat transfer from air convection. This corresponds to ~16.5% increase in steady state voltage because of heatsink and 83.7% increase due to the air flow on the cold side of the TEG. As expected, the air flow induces enhancement of the heat dissipation at $\Delta T=60^\circ$ C. and the output voltages hit a plateau faster in this working condition. This result reveals that the printed stretchable heatsink can be more efficient in larger temperature gradients and boundary conditions. However, owing to 3D printing technique and novel properties of LMEC, a wide range of flexible and stretchable heatsinks with arbitrary design and geometry can be 3D printed to further enhance the thermal management and energy harvesting in thermoelectric systems.

Inks of elastomer composites are formulated to print thermal interface layers, a thermal insulation layer, and electrical conductors that connect an array of 120 Bi2Te3 semiconductors in a thermoelectric device. By adjusting the size of embedded liquid metal droplets in PDMS, stretchable liquid metal elastomer composites are engineered to be either electrically conductive or insulating while having a high thermal conductivity. In addition, hollow microspheres are dispersed in PDMS to create printable inks for thermal insulation layer. This additive fabrication of elastomer-based TEG resulted in fabrication of high-performance energy harvesting units capable of generating an average open-circuit voltage of 392 mV and a power density of 649.9 W/cm^2 at $\Delta T=60^\circ$ C. Moreover, this thermoelectric generator shows high flexibility and excellent durability as it can remain intact even after 15,000 cycles of 30% tensile strain without any change in device functionality. These unique characteristics are achieved by levering 3D printing and tunning the material properties of each layer in the TEG device. One can also demonstrate the other advantages of additive manufacturing by direct printing of a thermoelectric module on a textile substrate for wearable applications and 3D printing of a stretchable heatsink for improved thermal management at elevated temperatures. In the future, the performance of these stretchable thermoelectric generators is likely to be improved by optimizing the device architecture and material selection, while their emerging applications in self-powered wearable electronics, thermo-haptic sensors, soft robotics, and human-computer interactions are being explored.

Thermal Interface Ink Formulation: The LMEC ink for thermal interface layer can be prepared by mixing Eutectic gallium indium (EGaIn-75 wt % Ga and 25 wt % In) with a PDMS (Sylgard 184; Dow Chemicals). PDMS part A can be placed under immersion mixer (Caframo, BDC250) with 600 RPM for 30 minutes in a 20 ml plastic cup. Then EGaIn is applied into the plastic pot drop by drop using syringe until EGaIn takes 50% volume fraction of the total ink. After immersion mixing the ink, PDMS part B (curing agent) can be added to the ink with a $\frac{1}{10}$ weight of the PDMS part A (10:1 mass ratio). Hexane can be added to 5 wt % of total ink to lower the viscosity. The ink can be mixed again using planetary shear mixer (FlackTek Inc, DAC 150.1 FVZ-K) for 1 minute with 2500 RPM.

Interconnect Ink Formulation: PDMS (Sylgard 184; Dow Chemicals) part A and B are prepared by 10:1 mass ratio in the 20 ml vial. Then EGaIn can be added to fulfill the volume fraction of 30% volume fraction of the total ink. The vial can be placed in the planetary shear mixer (FlackTek Inc, DAC 150.1 FVZ-K) for 5 minutes with 700 RPM until the shearing force breaks EGaIn into smaller particles and the size of the EGaIn particles in the interconnection ink becomes ~150 μm. This LMEC ink for interconnection can be then transferred into the syringe for printing. The ink can be separated by PDMS-rich zone and LM-rich zone after 15 minutes due to the density difference.

Heat insulation Layer Ink Formation: Expancel (551 DE 40 d42; Nouryon) and PDMS (Sylgard 184; Dow Chemicals) are added with the volume ratio of 1:1 in the plastic cup and hand mixed for one minute. Then PDMS part B can be added to tenth of weight of Sylgard 184 part A. The total ink can be shear mixed at 2500 RPM for 1 minute by the planetary shear mixer (FlackTek Inc, DAC 150.1 FVZ-K).

Printing Process: A high-precision dispenser system (Musashi Engineering—ML 808GX) on a 3-axis robotic arm equipped with a heated vacuum plate can be used for direct writing three different types of inks. For thermal interface layer printing with LMEC ink, the printing can be conducted with the parameter of 7 kPa and 5 mm/s with 18-gauge needle. For printing interconnect ink, the ink can be placed on the syringe for 15 minutes before the printing. The printing parameter for interconnection ink can be 60 kPa and 1.5 mm/s with a 32-gauge needle. The interconnect printing can be conducted twice for a good electrical conductivity. For the heat insulation layer printing, the syringe with the 32-gauge needle can be used with the parameter of 190 kPa and 1.5 mm/s. Heat insulation layer printing can be also conducted twice to fill the gap between the thermoelectric semiconductors. After the printing of each layer, the curing process can be followed to bond the elastomer chains in the composites. The thermal interface layer can be baked in the oven at 90° C. for 4 hours. For thermal insulation layer and interconnects, TEG can be baked in the oven at 90° C. for 3 hours after printing.

Thermal conductivity measurement: A 25 μm diameter platinum wire can be soldered at each end to stranded copper wire to measure the thermal conductivity of materials using the transient hot-wire method. The platinum wire can be casted within target materials inside of a 70×11×4 mm^3 acrylic mold. After curing, the casted sample can be connected to a source-meter (Keithley 2450), and the voltage can be measured while applying a consistent 100 mA current for 0.9 seconds. The thermal conductivity of each material can be then calculated as a function of platinum wire length, the output voltage, and the current. During this calculation, a nonlinear fitting technique can be applied in order to derive the thermal conductivity, as used in previous work.

Rheology Method: The rheology experiments can be done by using a modular compact rheometer (Anton Parr MCR 302) with a thermal chamber attached 25 mm parallel plate geometry. Samples can be mixed for 1 minute at 2000 RPM on a shear mixer (FlackTek Inc, DAC 150.1 FVZ-K). Then a 5 ml pipette can be used to disperse the resin on the 25 mm parallel plate. Each material sample can be tested from 1 to 100 seconds and held at 22° C. for the duration of the test.

The printed wearable TEG device can be connected to an oscilloscope (Tektronix, TDS2004C) to measure the output voltage. The hot plate stirrer (FISHERBRAND™ ISOTEMP™, SP88857200) can be used as a heat source. Before loading the device on the hot plate, one can measure the temperature of the hot plate and the thermal interface layer using thermometer (Fluke, 62 MAX Infrared Thermometer) to achieve exact temperature difference. The device can be placed on the hot plate and the output voltage can be measured for 120 seconds at each test. To measure the generated power of the printed TEG, the resistance decade box (Extech, 380400) can be connected to the device in parallel to be utilized as the external resistance (Rex). The output voltage can be measured at each point and converted to the power and power density by calculating it.

A 70×11×2.4 mm^3 tensile TEG sample can be fabricated to investigate the structural integrity. Using PCB board and the external power supply (Electro Industries, DIGI 35A), the sample can be connected to a voltage divider. The steady resistor in the voltage divider had 15.78Ω resistance and the input voltage from the power source can be 2.6 V. The voltage that is divided to the tensile sample can be collected during the testing time using Arduino and LabVIEW from NATIONAL The cyclic loading test bed can be controlled with a microcontroller, such as an Arduino. The sample can be under 30% strain uniaxial tensile test for 15,000 cycles. The strain rate can be 20 mm/min. The energy harvesting performance of this sample can be measured before and after the cyclic loading test using the same method that used for the voltage and power measurement to determine an electromechanical robustness. The tensile sample can be also placed on the testing system (Instron 68SC-2) to acquire the hysteresis data. The strain rate can also be 20 mm/min throughout the 10 cycles. The force and the strain can be plotted to display the hysteresis behavior of the TEG.

Figure 7:
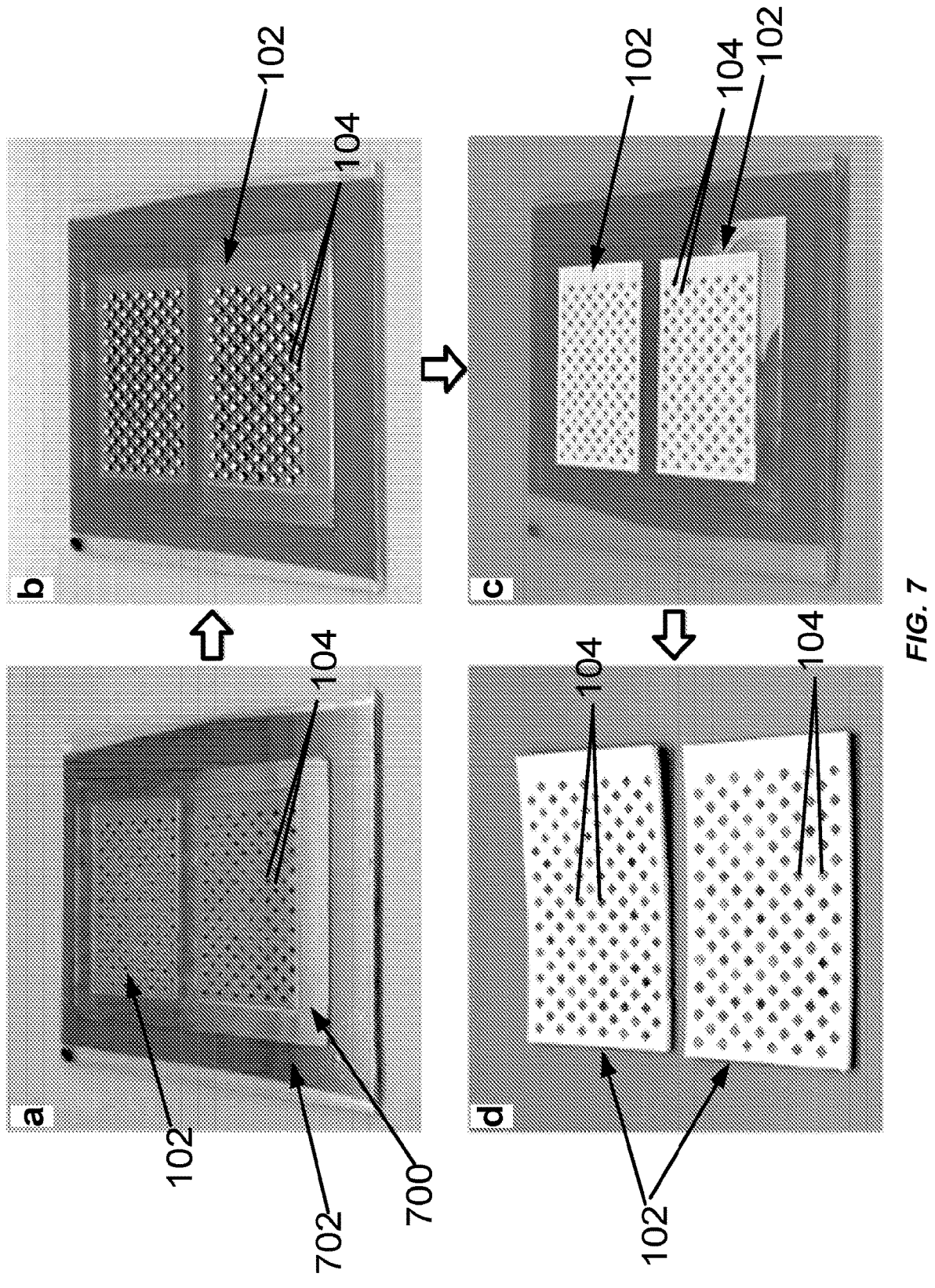
FIGS. 7a, 7b, 7c, and 7d includes exemplary illustrations of portions of a core layer of a stretchable thermoelectric generator during various stages of a manufacturing process, according to some aspects of the present disclosure.

FIG. 7 includes exemplary illustrations of portions of a stretchable thermoelectric generator manufacturing process. FIG. 7 shows an example of a step-by-step fabrication process of the core layer 102 with embedded thermoelectric (TE) pellets 104. First, a low tack adhesive tape 700 can be used to hold the arranged p/n-type thermoelectric pellets 104, as shown in FIG. 7a. In some examples, an acrylic mold 702 can be cut and placed on the adhesive tape to precisely control the size of the device. FIG. 7b shows the freestanding TE pellets 104 and the mold before printing the hollow microsphere elastomer composite (HMEC). Next, the HMEC ink can be printed along the path between the TE semiconductors and cured in an oven at 90° C. for 3 hours. In the next step, the mold can be removed to prepare the core layer 102 with embedded TE pellets 104, as shown in FIG. 7c. FIG. 7d shows two core layers 102 with embedded TE pellets 104 that can be used to fabricate two thermoelectric devices. As illustrated in this photo, the elastomeric layers can stand alone without using any fixture or clamp on other surfaces. Prior to printing the liquid metal elastomer composites, a stencil (e.g., made of the same tape as the tape 700) can be used to spray EGaIn on the exposed surface of the TE pellets on one side.

After completing the printing process for both electrical interconnects and thermal interface materials on one side, the same process was repeated on the other side of the device. While the output power is directly related to the internal resistance of the device, the total resistance of the device can be induced by adding up three factors which are resistance from the interconnects, the TE pellets, and the contact resistance. The temperature difference across the TEG device for wearable application can be largely affected by three main sources of parasitic thermal resistances: Human skin, skin-device contact interface, and device-ambient convection. The series of these thermal barriers confines the temperature difference between the heat source and the ambient which decreases the energy harvesting performance as a result. By ignoring Peltier heating and cooling, and Joule heating effects, simplified equations for $\Delta T_{TEG}$ can be expressed as following:

$$\Delta T_{TEG} = (T_{HeatSource} - T_{Ambient}) \frac{R_{TEG}}{R_{Body} + R_{TEG} + R_{Conv}} \quad (1)$$

Equation 1 can be used to derive the open circuit voltage VOC produced by the temperature difference within the TEG device that can be given by:

$$V_{OC} = N(\alpha_n + \alpha_p) * \Delta_{TEG} \quad (2)$$

Where N denotes the number of pairs of TE pellets present in the device. $\alpha_n$ and $\alpha_p$ represent the Seebeck coefficients of n and p-type Bi2Te3 that are −161 µV/K and 176 µV/K at room temperature, respectively. Based on experimental result and the simplified modeling, $\Delta T_{TEG}$=19.4K and dimensionless thermal resistance ratio acted on the device (RTEG/(Rbody+RTEG+Rconv)) is ~ 0.34 at T=60° C. While decreasing parasitic thermal resistance proportionally can improve the TEG performance, a 3D printed heatsink can boost convective heat transfer from the airflow that consequently regulate the thermal resistance on the cold side (Rconv).

Figure 8:
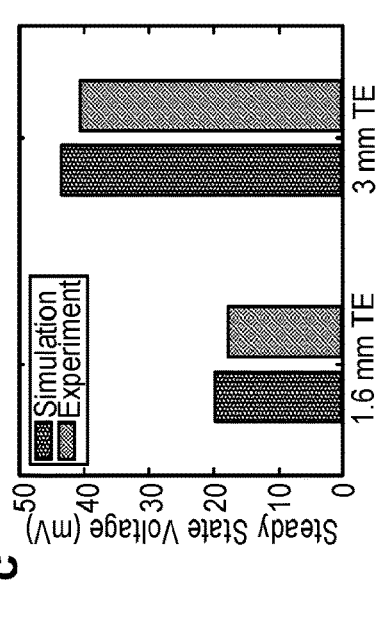
FIGS. 8a, 8b, and 8c include exemplary graphs depicting differences between temperature gradients within stretchable thermoelectric generators and the corresponding temperature gradients corresponding to an environment, according to some aspects of the present disclosure.
Figure 8:
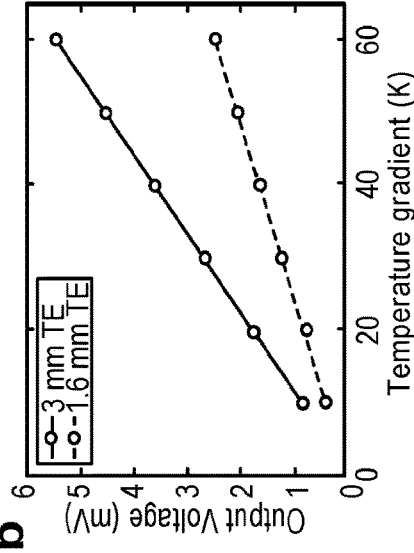
Figure 8:
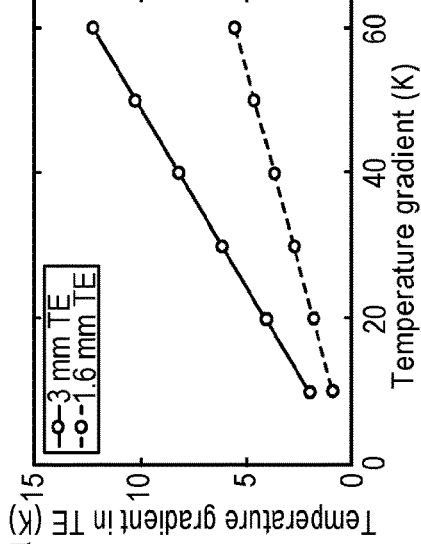

FIGS. 8a, 8b, and 8c include exemplary graphs depicting differences between temperature gradients within stretchable thermoelectric generators and the corresponding temperature gradients corresponding to an environment, according to some aspects of the present disclosure. The dimensions of the embedded thermoelectric material (known as pellets or legs) can affect device performance. High aspect ratio (i.e., taller) semiconductors can harvest more energy compared to the low aspect ratio (i.e., shorter) counterparts. First, the increased distance between the hot and cold surfaces, which is the farthest point from the heat source, facilitates the larger temperature gradient inside the semiconductor. This facilitates more use of the Seebeck effect to harvest the electrical energy from the temperature difference. Also, having a larger volume of the thermoelectric material itself can facilitate the output voltage. In an example, a pair of bismuth telluride legs with dimensions of 1.4×1.4×3 $mm^3$ and a pair of bismuth telluride legs with dimensions 1.4×1.4×1.6 $mm^3$ can be compared. This can correspond to a 87.5% volumetric increase in the thermoelectric material that converts the thermal energy to electricity. The experimental result at temperature gradient of 60° C. agrees with the simulation result as shown in FIG. 8c. Although examples include legs with heights of 1.6 mm and 3 mm, any larger or smaller suitable size may be utilized for legs.

Figure 9:
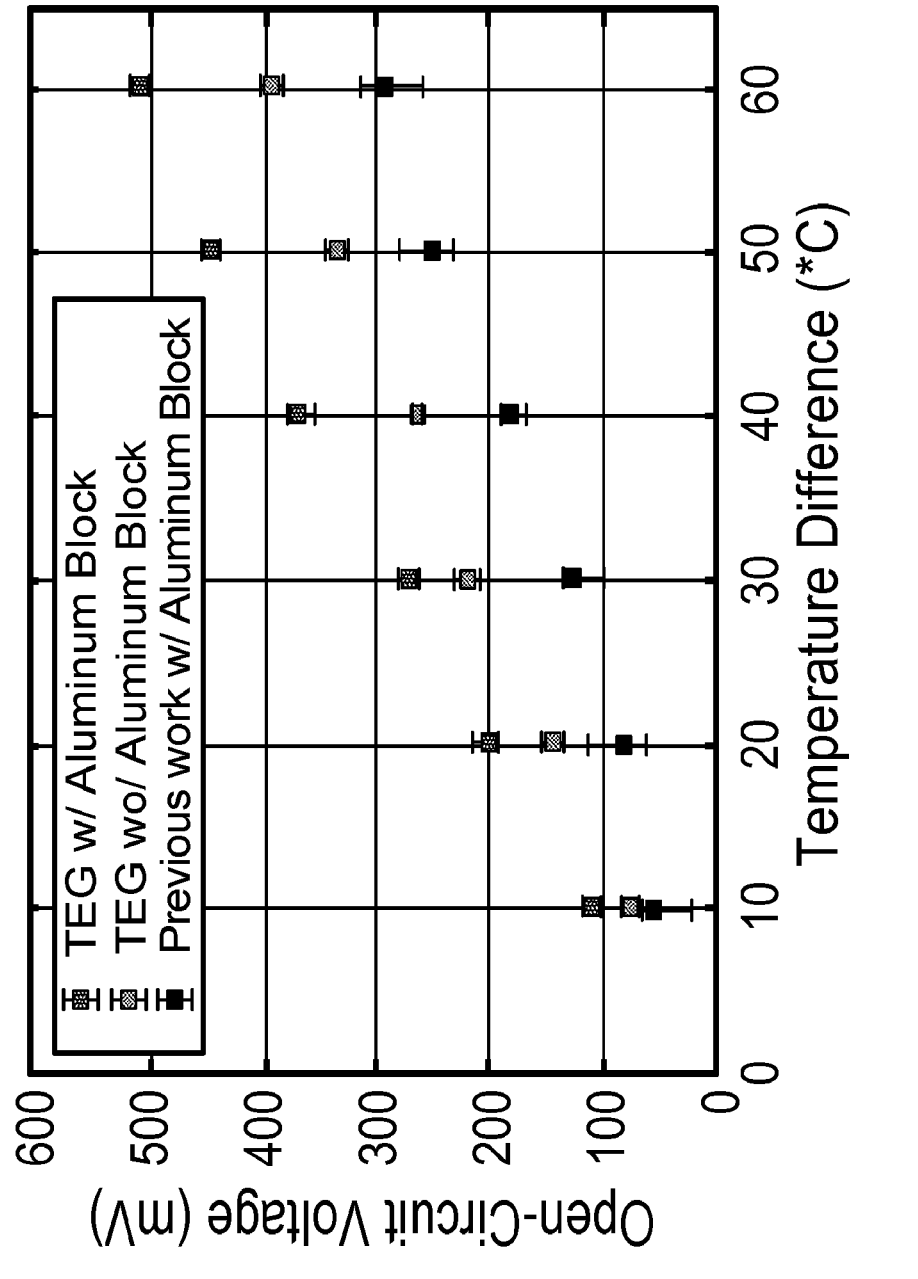
FIG. 9 is an exemplary graph of open-circuit voltages of various stretchable thermoelectric devices according to some aspects of the present disclosure.

FIG. 9 is an exemplary graph of open-circuit voltages of various stretchable thermoelectric devices according to some aspects of the present disclosure. In particular, the data depicted in the graph includes open circuit voltages of printed wearable thermoelectric generator with and without an aluminum block placed thereon. The graph shows that the thermoelectric generator may have an increased open-circuit voltage when an aluminum block is placed thereon than when an aluminum block is not present.

In some examples, the thermoelectric generator can be wearable and elastically stretchable. Fabricating the wearable and elastically stretchable thermoelectric generator can involve arranging a set of thermoelectric pellets (i.e., legs.) In some examples, the thermoelectric pellets can be arranged in a mold or other confined space. Fabricating the thermoelectric generator can further involve printing a thermal insulation material alongside and/or around the plurality of thermoelectric pellets to form a core layer. The core layer can include thermal insulation material and the thermoelectric pellets. Fabricating the thermoelectric generator can involve curing the core layer. Curing the core layer can involve annealing or otherwise heat-treating one or more portions of the thermoelectric generator.

Selectively depositing a liquid metal on the thermoelectric pellets embedded in the core layer to form contact points. For example, liquid metal can form contact points on each of the thermoelectric pellets. In some examples, fabricating the wearable and elastically stretchable thermoelectric generator can involve printing conductive ink comprising liquid metal droplets in an arrangement forming stretchable electrical interconnects that define connections among the thermoelectric pellets via the contact points so as to form an initial middle layer that includes the stretchable electrical interconnects.

In some examples, fabricating the thermoelectric generator can involve printing a thermal interface material so as to form an initial outer layer, wherein the initial middle layer is positioned between the initial outer layer and an initial side of the core layer to form a layered assembly. Fabricating the thermoelectric generator can involve inverting the layered assembly to expose a subsequent side of the core layer disposed opposite the initial side. Once the layered assembly has been inverted additional conductive ink can be deposited to form a subsequent middle layer. Fabricating the thermoelectric generator can involve printing an additional thermal interface material to form a subsequent outer layer, wherein the subsequent middle layer is positioned between the subsequent outer layer and the core layer.

The complete disclosure of all patents, patent applications, and publications, and electronically available material cited herein are incorporated by reference in their entirety. Supplementary materials referenced in publications (such as supplementary tables, supplementary figures, supplementary materials and methods, and/or supplementary experimental data) are likewise incorporated by reference in their entirety. In the event that any inconsistency exists between the disclosure of the present application and the disclosure(s) of any document incorporated herein by reference, the disclosure of the present application shall govern. The foregoing detailed description and examples have been given for clarity of understanding only. No unnecessary limitations are to be understood therefrom. The disclosure is not limited to the exact details shown and described, for variations obvious to one skilled in the art will be included within the disclosure defined by the claims.

The description of embodiments of the disclosure is not intended to be exhaustive or to limit the disclosure to the precise form disclosed. While the specific embodiments of, and examples for, the disclosure are described herein for illustrative purposes, various equivalent modifications are possible within the scope of the disclosure.

Specific elements of any foregoing embodiments can be combined or substituted for elements in other embodiments. Moreover, the inclusion of specific elements in at least some of these embodiments may be optional, wherein further embodiments may include one or more embodiments that specifically exclude one or more of these specific elements. Furthermore, while advantages associated with certain embodiments of the disclosure have been described in the context of these embodiments, other embodiments may also exhibit such advantages, and not all embodiments need necessarily exhibit such advantages to fall within the scope of the disclosure.

As used herein and unless otherwise indicated, the terms "a" and "an" are taken to mean "one", "at least one" or "one or more". Unless otherwise required by context, singular terms used herein shall include pluralities and plural terms shall include the singular.

Unless the context clearly requires otherwise, throughout the description and the claims, the words 'comprise', 'comprising', and the like are to be construed in an inclusive sense as opposed to an exclusive or exhaustive sense; that is to say, in the sense of "including, but not limited to". Words using the singular or plural number also include the plural and singular number, respectively. Additionally, the words "herein," "above," and "below" and words of similar import, when used in this application, shall refer to this application as a whole and not to any particular portions of the application.

Unless otherwise indicated, all numbers expressing quantities of components, molecular weights, and so forth used in the specification and claims are to be understood as being modified in all instances by the term "about." Accordingly, unless otherwise indicated to the contrary, the numerical parameters set forth in the specification and claims are approximations that may vary depending upon the desired properties sought to be obtained by the present disclosure. At the very least, and not as an attempt to limit the doctrine of equivalents to the scope of the claims, each numerical parameter should at least be construed in light of the number of reported significant digits and by applying ordinary rounding techniques.

Notwithstanding that the numerical ranges and parameters setting forth the broad scope of the disclosure are approximations, the numerical values set forth in the specific examples are reported as precisely as possible. All numerical values, however, inherently contain a range necessarily resulting from the standard deviation found in their respective testing measurements.

All headings are for the convenience of the reader and should not be used to limit the meaning of the text that follows the heading, unless so specified.

All of the references cited herein are incorporated by reference. Aspects of the disclosure can be modified, if necessary, to employ the systems, functions, and concepts of the above references and application to provide yet further embodiments of the disclosure. These and other changes can be made to the disclosure in light of the detailed description.

It will be appreciated that, although specific embodiments of the disclosure have been described herein for purposes of illustration, various modifications may be made without deviating from the spirit and scope of the disclosure. Accordingly, the disclosure is not limited except as by the claims.

What is claimed is:

1. A method of fabricating a wearable and elastically stretchable thermoelectric generator, the method comprising:

arranging a plurality of thermoelectric pellets;

printing a thermal insulation material alongside and/or around the plurality of thermoelectric pellets to form a core layer that includes the thermal insulation material and the plurality of thermoelectric pellets, wherein the thermal insulation material comprises an elastomer composite with embedded hollow microspheres, and wherein the printing the thermal insulation material positions at least some of the embedded hollow microspheres between at least some of the thermoelectric pellets;

curing the core layer to expand hollow microspheres within the core layer so as to decrease a density of the core layer to be less than before the curing;

selectively depositing a liquid metal on the thermoelectric pellets embedded in the core layer to form contact points;

printing conductive ink comprising liquid metal droplets in an arrangement forming stretchable electrical interconnects that define connections among the thermoelectric pellets via the contact points so as to form an initial middle layer that includes the stretchable electrical interconnects;

printing a thermal interface material so as to form an initial outer layer, wherein the initial middle layer is positioned between the initial outer layer and an initial side of the core layer to form a layered assembly;

inverting the layered assembly to expose a subsequent side of the core layer disposed opposite the initial side;

printing additional conductive ink to form a subsequent middle layer; and printing an additional thermal interface material to form a subsequent outer layer, wherein the subsequent middle layer is positioned between the subsequent outer layer and the core layer.

2. The method of claim 1, wherein the liquid metal droplets for stretchable electrical interconnects comprise eutectic gallium indium.

3. The method of claim 1, wherein the thermal insulation material comprises an elastomer composite with embedded hollow microspheres.

4. The method of claim 1, further comprising applying a pressure or other mechanical forces to the core layer subsequent to curing the core layer and with magnitude sufficient to activate the liquid metal percolating networks.

5. The method of claim 1, wherein the thermal interface material comprises a liquid metal elastomer composite with a liquid metal volume fraction of 50% $V_f$ with respect to an elastomer base that has a thermal conductivity of between 1 and 1.7 W $m^{-1}K^{-1}$.

6. The method of claim 1, wherein the thermal insulation material comprises a hollow microsphere embedded elastomer composite with a thermoplastic microsphere volume fraction of 50% $V_f$ with respect to an elastomer base that has a thermal conductivity of between 0.09 and 0.12 W·$m^{-1}$·$K^{-1}$.

7. A method of fabricating a stretchable thermoelectric device, the method comprising:

depositing a thermal insulation material alongside and/or around a plurality of thermoelectric pellets to form a core layer that includes the thermal insulation material and the plurality of thermoelectric pellets, wherein the thermal insulation material comprises an elastomer composite with embedded hollow microspheres, and wherein the depositing the thermal insulation material positions at least some of the embedded hollow microspheres between at least some of the thermoelectric pellets;

curing the core layer to expand hollow microspheres within the core layer so as to decrease a density of the core layer to be less than before the curing;

depositing material to form an initial middle layer comprising stretchable electrical interconnects arranged as connections among the thermoelectric pellets;

depositing a thermal interface material to form an initial outer layer, wherein the initial middle layer is positioned between the initial outer layer and the core layer; and depositing a subsequent middle layer and a subsequent outer layer on an opposite side of the core layer with respect to the initial middle layer and initial outer layer.

8. The method of claim 7, wherein the material comprises liquid metal droplets of eutectic gallium indium.

9. The method of claim 7, wherein the thermal insulation material comprises a hollow microsphere embedded elastomer composite with a thermoplastic microsphere volume fraction of 50% $V_f$ with respect to an elastomer base that has a thermal conductivity of between 0.09 and 0.12 W·$m^{-1}$·$K^{-1}$.

10. The method of claim 7, wherein the depositing the subsequent middle layer comprises depositing subsequent material to form the subsequent middle layer with stretchable electrical interconnects arranged as connections among the thermoelectric pellets, and wherein depositing the subsequent outer layer comprises depositing a subsequent thermal interface material to form the subsequent outer layer, such that the subsequent middle layer is positioned between the subsequent outer layer and the core layer.

11. The method of claim 7, further comprising selectively depositing a liquid metal on the thermoelectric pellets of the core layer.

12. The method of claim 7, further comprising applying a pressure to the core layer subsequent to curing the core layer.

* * * * *